United States Patent [19]

Uytterhoeven et al.

[11] Patent Number: 5,607,813

[45] Date of Patent: Mar. 4, 1997

[54] PHOTOPOLYMERIZABLE COMPOSITION OF HIGH SENSITIVITY AND METHOD FOR OBTAINING IMAGES THEREWITH

[75] Inventors: Herman J. Uytterhoeven, Bonheiden, Belgium; Michael Müller, Bergisch Gladbach; Wolfgang Podszun, Köln, both of Germany; Marc I. Van Damme, Heverlee, Belgium; Hans-Josef Laas, Köln, Germany

[73] Assignee: Agfa-Gevaert, N.V., Mortsel, Belgium

[21] Appl. No.: 446,715

[22] PCT Filed: Dec. 15, 1993

[86] PCT No.: PCT/EP93/03634

§ 371 Date: May 30, 1995

§ 102(e) Date: May 30, 1995

[87] PCT Pub. No.: WO94/17452

PCT Pub. Date: Aug. 4, 1994

[30] Foreign Application Priority Data

Jan. 20, 1993 [EP] European Pat. Off. ............ 93200140

[51] Int. Cl.⁶ .................. G03F 7/027; G03F 7/30; G03F 7/34
[52] U.S. Cl. .................. 430/252; 430/284.1; 430/283.1; 430/253; 430/254; 430/271.1; 430/273.1; 430/325; 430/258; 522/97; 522/96
[58] Field of Search .............. 430/284.1, 283.1, 430/252, 353, 254, 271.1, 273.1, 325, 258; 522/97, 96

[56] References Cited

U.S. PATENT DOCUMENTS

| | | | |
|---|---|---|---|
| 4,224,454 | 9/1980 | McDowell et al. | 522/96 X |
| 4,309,561 | 1/1982 | Huemmer et al. | 522/96 X |
| 4,330,657 | 5/1982 | Disteldorf et al. | 522/96 X |
| 4,582,885 | 4/1986 | Barber | 522/96 X |
| 4,691,045 | 9/1987 | Fukuchi et al. | 522/96 X |
| 4,761,363 | 8/1988 | Hung et al. | 430/284.1 |
| 4,985,473 | 1/1991 | Williams et al. | 522/96 X |
| 5,328,804 | 7/1994 | Podszun et al. | 430/254 X |

*Primary Examiner*—Cynthia Hamilton
*Attorney, Agent, or Firm*—Breiner & Breiner

[57] ABSTRACT

The present invention provides an imaging element comprising on a support a photosensitive layer containing a photopolymerizable composition containing a urethane type monomer mixture according to the formula (I) as defined in the claims and description. There is further provided a method for obtaining images and/or a lithographic printing plate therewith.

9 Claims, No Drawings

PHOTOPOLYMERIZABLE COMPOSITION OF HIGH SENSITIVITY AND METHOD FOR OBTAINING IMAGES THEREWITH

FIELD OF THE INVENTION

The present invention relates to the formation of images by means of photopolymerization. More particularly the present invention relates to a method for producing multiple copies of an image.

BACKGROUND OF THE INVENTION

The use of photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc ... The thus produced differences may be subsequently employed in a developing step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poot and J. Willems, Focal Press London-New York, first edition 1978, pages 33 to 39.

The use of the difference in tackiness to obtain an image is described in e.g. U.S. Pat. Nos. 3,060,024, 3,085,488 and 3,649,268. According to the method disclosed in these U.S. patent applications the image-wise exposed photopolymerizable composition looses its tackiness in the exposed parts while the non-exposed parts keep their tackiness. The non-exposed parts can therefore be colored with dry dye pigments to make the image visible.

According to the methods described in e.g. U.S. Pat. No. 3,245,796 and EP-A 362,827 the diffusibility of a dye is impeded in the photo-exposed parts of the photopolymerizable composition so that during an overall thermal heating subsequent to photo-exposure dye substances in the non-exposed areas will be able to diffuse to a receptor material. According to a similar method described in U.S. Pat. No. 4,587,198 the photopolymerizable composition is made impermeable in the exposed parts for a sublimable dye or dye-pigment present in a layer adjacent to the layer comprising the photopolymerizable composition.

According to a method disclosed in U.S. Pat. No. 3,060,023 the adhesion of the photopolymerizable composition is modified upon image-wise exposure. After image-wise exposure the non-exposed parts will stick or adhere, during a step of overall heating, to a receiving sheet thus allowing the transfer of the non-exposed parts to the receiving sheet.

In EP-A-502562 there are disclosed urethane type multi functional monomers for use in an imaging element. The disclosed imaging element is of high speed and the obtained images are of high quality. However it is desirable to further improve the speed of these imaging elements especially when the imaging elements are to be used in thermal transfer processing.

SUMMARY OF THE INVENTION

It is an object of the present invention to provide a method for reproducing images in a convenient and ecological way using a photopolymerizable composition of high sensitivity.

It is a further object of the present invention to provide a method for producing a lithographic printing plate in a convenient and ecological way using a photopolymerizable composition of high sensitivity.

Further objects of the present invention will become clear from the description hereinafter.

According to the present invention there is provided an imaging element comprising on a support a photosensitive layer containing a photopolymerizable composition containing a monomer mixture according to formula (I):

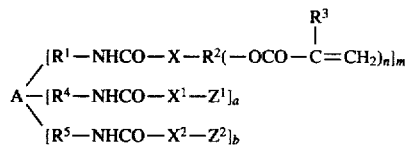

wherein

A represents an organic group of the following nature being 2 to 6 valent:
  a) a hydrocarbon residue containing 5 to 25 carbon atoms that may be interrupted by one or more ether, ester or amide functions;
  b) a di- or tri-valent condensed urea residue;

X, $X^1$, $X^2$ each independently represents —O— or —NR— wherein R represents an alkyl group of 1 to 12 carbon atoms and that can be substituted, $R^1$, $R^4$, $R^5$ each independently represent a divalent hydrocarbon residue having 1 to 25 carbon atoms, $R^2$ represents a 2 to 6 valent linear or branched hydrocarbon residue containing 2 to 18 carbon atoms, $R^3$ represents hydrogen or methyl, n represents an integer of 1 to 5, $Z^1$ represents a non-ionic or ionic hydrophilic group containing at least one of the following functionalities:
  a polyalkyleneoxy group,
  an acid group or a salt thereof,
  an ammonium group $Z^2$ represents a hydrophobic group having one of the following meanings:
  an alkyl, cycloalkyl, arylalkyl, alkylaryl or aryl group each being substituted or not and having at least 4 carbon atoms,
  an alkoxy group having at least 4 carbon atoms and that may be substituted or not,
  fluoro alkyl group or perfluoro alkyl group having at least 4 carbon atoms,
  a silicone group, m, a and b are fractional indexes respectively representing the relative amount in said monomer mixture of the group indexed by said indexes m, a and b of formula (I) and whereby the amount of (meth)acrylate groups in 100 g of said monomer mixture is between 0.1 and 0.8 mol, more preferably between 0.15 mol and 0.6 mol and at least one of a or b is different from 0 and m also differs from 0.

According to the present invention there is also provided a method for making images and/or a lithographic printing plate using the above defined imaging element.

DETAILED DESCRIPTION OF THE PRESENT INVENTION

Imaging elements according to the present invention show a high speed and yield images of good quality. The highest speeds are obtained with monomer mixtures having a high polyalkylene oxide content. Preferably the alkyleneoxy content in the monomer mixture according to general formula (I) is between 0.04 and 2.5 mol per 100 g of monomer mixture, more preferably between 0.1 and 1.5 mol per 100 g of monomer mixture. The imaging element in accordance with the present invention is especially suitable for use in methods whereby an image is developed using thermal transfer of the non-exposed or insufficiently exposed parts of a photopolymerizable composition in accordance with the present invention to an image receiving material.

A further advantage of the photopolymerizable composition in accordance with the invention is that due to the presence of the hydrophilic group $Z^1$ photopolymerizable compositions can be prepared that can be coated from an aqueous solution.

By the definition of the monomer mixture according to formula (I) is meant that the mixture comprises monomers having groups indexed by m, a, and/or b such that the total content of each of these groups is in accordance with the definition and whereby m, a and b represent the relative content of each of the different groups. Thus a mixture according to general formula (I) may for example consist of monomers having groups m together with groups b, monomers having groups indexed by m together with groups indexed by a, monomers having groups indexed by a together with groups indexed by b, monomers having groups indexed by a together with groups indexed by b and indexed by m etc . . .

Hydrocarbon residues A according to formula (I) are preferably aliphatic or they may be aromatic hydrocarbon residues or combinations of aromatic and aliphatic hydrocarbon residues. With the term hydrocarbon residue in connection with the present invention is meant a group consisting only of carbon and hydrogen atoms. Examples are alkyl groups, alkylaryl groups, alkyl groups containing double or triple bonds or mono- or polycyclic saturated or aromatic hydrocarbon residues having 6 to 24 C-atoms such as those examplified for $R^2$ below. Preferred hydrocarbon groups A are:

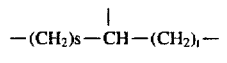
(Ia)

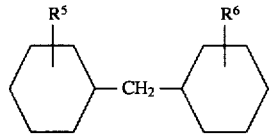
(Ib)

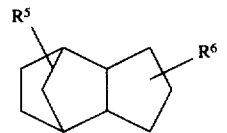
(Ic)

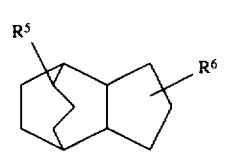
(Id)

wherein $R^6$ and $R^7$ each independently represent hydrogen of a lower alkyl having 1 to 6 carbon atoms, s and t independently represent an integer of 1 to 6 and wherein the aliphatic hydrocarbon residues Ib to Id comprise 2 to 6 free valences.

Examples of condensed urea groups A according to formula (I) are:

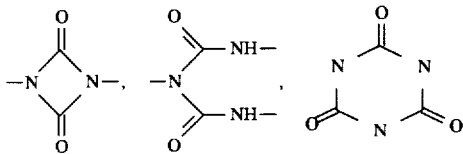

X, $X^1$ or $X^2$ in formula (I) preferably represent an oxygen bridge (—O—). In case X, $X^1$ or $X^2$ represents —NR—, R is preferably a linear or branched alkylene e.g. methylene, ethylene, propylene and t-butylene. The hydrocarbon residues represented by $R^1$, $R^4$ and $R^5$ are preferably (cyclo)aliphatic or aromatic hydrocarbon residues or combinations thereof. They may be interrupted by one or more oxygen bridges. Examples of hydrocarbon residues $R^1$, $R^4$ and $R^5$ are (cyclo)aliphatic hydrocarbon residues containing 1 to 12 carbon atoms. Specific examples are ethylene, propylene, 1,4-tetramethylene, 1,6-hexamethylene, 2,2,4-trimethyl-1,6-hexamethylene, a hydrocarbon group according to one of the formulas Ia to Id or a mono- or polycyclic saturated or aromatic hydrocarbon residue having 6 to 24 C-atoms, preferably 6 to 14 C-atoms such as e.g.:

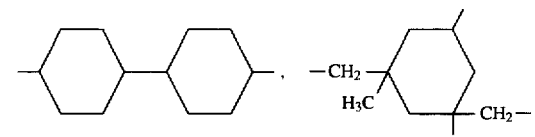

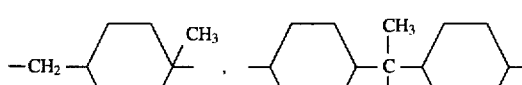

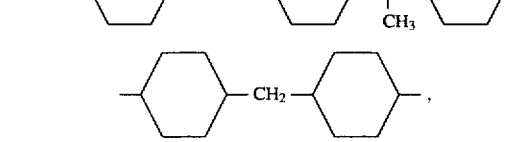

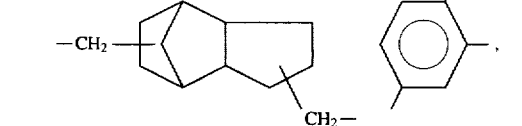

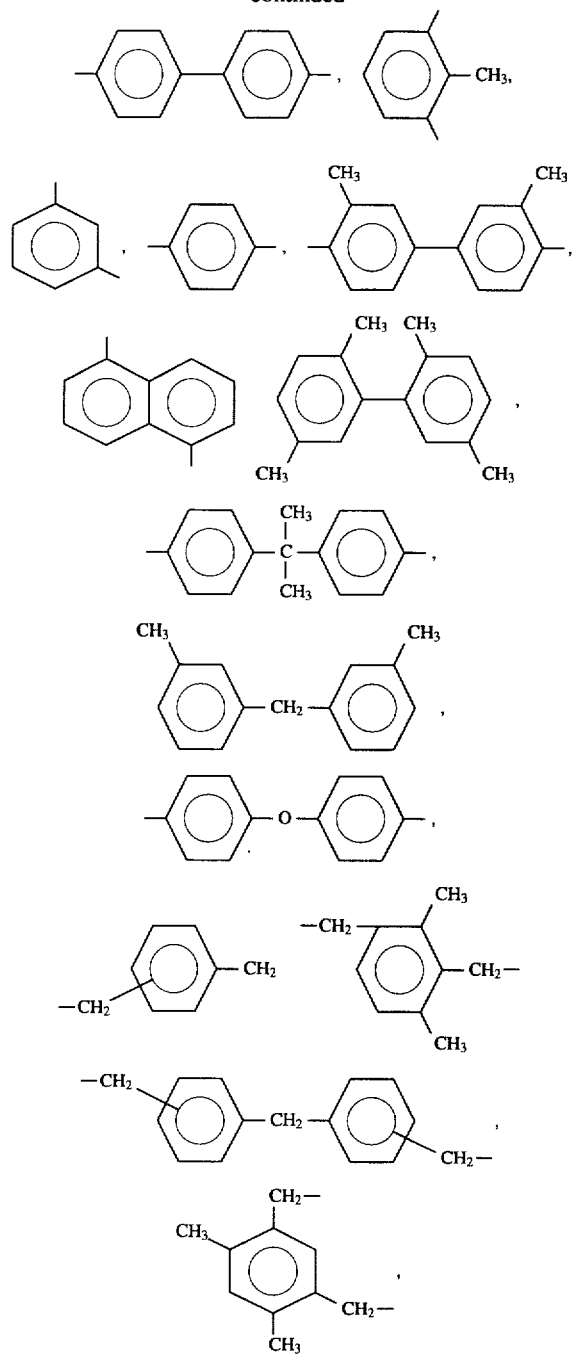

$R^2$ according to formula (I) is preferably a 2 to 4 valent hydrocarbon residue having 2 to 18 carbon atoms more preferably a linear or branched alkylene. Examples are mono- or polycyclic saturated or aromatic hydrocarbon residues e.g. as given for $R^1$ above, ethylene, propylene, 1,2-butylene or one of the following residues:

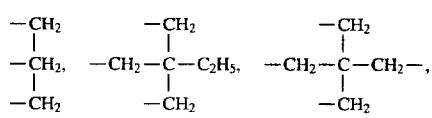

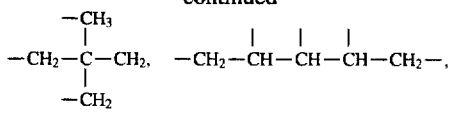

Preferred hydrophylic groups $Z^1$ for use in connection with the present invention are polyalkyleneoxy groups containing at least 5 alkyleneoxy units, more preferably at least 8 alkyleneoxy units and most preferably at least 10 alkyleneoxide units.

Examples of hydrophylic groups $Z^1$ for use in accordance with the present invention are polyethyleneoxy, polypropyleneoxy and copolymers thereof e.g.:

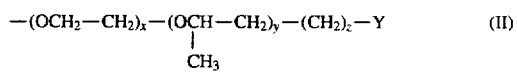

wherein x and y represent an integer such that their sum is 4 or more, preferably x is an integer of 5 to 70 and y is an integer of 1 to 20, z is an integer of 0 to 3 and Y represents a hydrogen, an alkyl group, alkoxy group, amine, amide, carboxylate, ester, hydroxyl, sulphonate, sulphate, phosphate, phosphonate, or a meth(acrylate) group. Further examples of hydrophilic groups $Z^1$ are carboxylates, sulphonates, sulphates, phosphonates, phosphates, carboxylic acid groups, sulphonic acid groups, phosphoric acid groups etc. Ammonium groups may also be used as hydrophilic groups $Z^1$. A preferred ammonium group is:

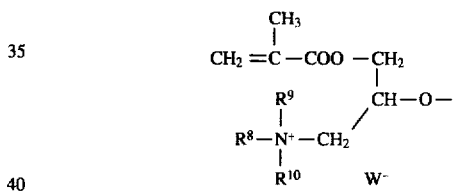

wherein $R^8$, $R^9$ and $R^{10}$ each independently represent hydrogen or an alkyl group and $W^-$ represents an anion e.g. $Cl^-$, $Br^-$, $I^-$, sulphonate, sulphide, phosphate, carbonate, nitrate, $OH^-$ Suitable hydrophobic groups $Z^2$ for use in connection with the present invention are e.g. long chain alkyls such as e.g. hexyl, heptyl, octyl, nonyl, decyl, undecyl, dodecyl, tridecyl, myristryl, pentadecyl, cetyl, heptadecyl, octadecyl, nonadecyl, eicosyl, ceryl, cerotyl, 2-hexyldecyl, 2-heptyldecyl, 2-decyltetradecyl, 2-hexadecyleicosyl, undecenyl, 9-octadecenyl, 9,12-octadecadienyl, 9-eicosenyl, cyclohexyl etc., aryl groups such as e.g. benzyl, naphtyl, 4-butylphenyl, groups derived from a condensation with with an isocyanate and one of the following alcohols: glycirinedioleate, glycerine-monohydroxy-stearate, methyl-12-hydroxystearate, 3-n.pentadecylphenol, eiscosofluoro-1-undecanol, heptadecafluoro-decanol, hexadecafluoro-1-nonanol, tridecafluoro-octanol, dodecafluoro-1-heptanol, polydimethylsiloxane terminated with a hydroxy group etc . . .

Specific examples of monomer mixtures suitable for use in accordance with the present invention are listed in table 1, 2 and 3.

TABLE 1

$$[G^2-CONH-(CH_2)_6]_u-N\underset{O=\diamond=O}{\diamond}N-[(CH_2)_6-NHCO-W^1]_v$$

$$\underset{[(CH_2)_6-NHCO-W^2]_w}{|N|}$$

| mixture no. | $W^1$ | $W^2$ | u | v | w | v + w | F | PAO |
|---|---|---|---|---|---|---|---|---|
| 1 | S1 | S1 | 89 | | | 11 | 0.41 | 0.21 |
| 2 | S1 | S1 | 92 | | | 8 | 0.45 | 0.16 |
| 3 | S1 | S7 | 46 | 8 | 46 | | 0.32 | 0.63 |
| 4 | S1 | S8 | 61 | 8 | 31 | | 0.37 | 0.16 |
| 5 | S1 | S8 | 46 | 8 | 46 | | 0.34 | 0.16 |
| 6 | S1 | S8 | 31 | 8 | 61 | | 0.33 | 0.16 |
| 7 | S4 | S4 | 99 | | | 1 | 0.46 | 0.04 |
| 8 | S9 | S9 | 67 | | | 33 | 0.34 | 0.20 |
| 9 | S1 | S10 | 61 | 8 | 31 | | 0.24 | 0.81 |
| 10 | S1 | S11 | 61 | 8 | 31 | | 0.14 | 1.38 |
| 11 | S6 | S6 | 67 | | | 33 | 0.34 | 0.18 |
| 12 | S12 | S12 | 67 | | | 33 | 0.34 | |
| 13 | S13 | S13 | 67 | | | 33 | 0.35 | |
| 14 | S13 | S13 | 80 | | | 20 | 0.36 | |

TABLE 2

$$[W^3-CONH-(CH_2)_6-]_pN\underset{CO}{\overset{CO}{\diamond}}N[-(CH_2)_6-NHCO-W^4]_q$$

| mixture no. | $W^3$ | $W^4$ | p | q | F | PAO |
|---|---|---|---|---|---|---|
| 15 | G2 | S1 | 90 | 10 | 0.42 | |
| 16 | G2 | S2 | 97 | 3 | 0.44 | |
| 17 | G2 | S1 | 95 | 5 | 0.44 | |
| 18 | G2 | S4 | 98 | 2 | 0.43 | |
| 19 | G2 | S4 | 97 | 3 | 0.42 | |
| 20 | G3 | S4 | 97 | 3 | 0.42 | |
| 21 | S7 | S4 | 97 | 3 | 0.18 | 1.04 |

Table 3 mixture no. 22

$$C\begin{cases}[CH_2-O-CO-(CH_2)_5-NHCO-G1]_{0.9}\\ [CH_2-O-CO-(CH_2)_5-NHCO-S5]_{0.4}\quad F=0.29\\ [CH_2-O-CO-(CH_2)_5-NHCO-G2]_{2.7}\quad PAO=0.83\end{cases}$$

In the above tables u, v, w, p and q represent the relative amount in mole % of the indexed group in the monomer mixture. F represents the amount of (meth)acrylate groups in mol per 100 g of the monomer mixture and PAO represents the amount of alkyleneoxyunits in mol per 100 g of the monomer mixture. In table 1 a figure for v and w is given only if $W^1$ and $W^2$ are distinct. The meanings of the abbreviations given in the different mixtures is as follows:

$-O-CH_2-CH_2-OOC-C(\backslash CH_3)=CH_2$  G1

-continued $CH_2-OOC-C(CH_3)=CH_2$
$-O-CH$
$CH_2-OOC-C(CH_3)=CH_2$  G2

$CH_2-OOC-CH=CH_2$
$-O-CH$
$CH_2-OOC-C(CH_3)=CH_2$  G3

$CH_3-(O-CH_2-CH_2)_8-O-$  S1

$CH_3$
$\vert$
$O\begin{bmatrix}-CH_2-(O-CH_2-CH_2)_{25.5}-O-\end{bmatrix}$  S2

$CH_3-(O-CH_2-CH_2)_{16.5}-O-$  S4

$CH_3-(O-CH_2-CH_2)_{42.5}-O-$  S5

$(CH_3)_2N-(CH_2)_2-O-(CH_2)_2-O-$  S6

$CH_2=C(CH_3)-CO-(O-CH_2-CH_2)_{4.5}-O-$  S7

$CH_2=C(CH_3)-COO-CH_2-CH(CH_3)-O-$
connected to $CH_3-N^+(CH_3)(CH_2)$ ... $Cl^-$  S8

$NaO_3S-CH_2-CH_2-O-$  S9

$NaO_3S-(CH_2)_3-(O-CH_2-CH_2)_{13}-O-$  S10

$NaO_3S-(CH_2)_3-(O-CH(CH_3)-CH_2)_5-(O-CH_2-CH_2)_{36}-O-$  S11 n-hexadecyloxy  S12 n-dodecyloxy  S13

The above listed monomer mixtures can be prepared as follows: In the preparation the following polyisocyanates were used (all percentages given are by weight and VAL represents gram equivalent):

A1: Isocyanate containing polyisocyanate on the basis of 1,6-diisocyanatohexane having an isocyanate content of 21.5% and an average isocynate functionality of 3.8. The viscosity was 3000 mPas at 23° C.

A2: Polether containing polyisocyanate on the basis of 1,6-diisocyanatohexane having an isocyanate content of 17.3% and a ethylene oxide content of 11.3%. The viscosity was 3050 mPas at 23° C. This colorless product was obtained by stirring at 100° C. a mixture of 1 VAL of A1 and 0.08 VAL of a monohydroxy functional polyethyleneoxide polyether having an average molecular weight of 350 corresponding to group S1 above.

A3: Polether containing polyisocyanate on the basis of 1,6-diisocyanatohexane having an isocyanate content of 15.9% and a ethylene oxide content of 15.3%. The viscosity was 4900 mPas at 23° C. This colorless product was obtained by stirring at 100° C. a mixture of 1 VAL of A1 and 0.11 VAL of a monohydroxy functional polyethyleneoxide polyether having an average molecular weight of 350 corresponding to group S1 above.

A4: Polether containing polyisocyanate on the basis of 1,6-diisocyanatohexane having an isocyanate content of 20.0% and a ethylene oxide content of 4.8%. The viscosity was 4750 mPas at 23° C. This colorless product was obtained by stirring at 100° C. a mixture of 1 VAL of A1 and 0.013 VAL of a monohydroxy functional polyethyleneoxide polyether having an average molecular weight of 750 corresponding to group S4 above.

A5: Uretdione- and isocyanurate containing polyisocyanate on the basis of 1,6-diisocyanatohexane having an isocyanate content of 21.9% and an average isocyanate functionality of 2.4. The viscosity was 150 mPas at 23° C.

The following alcohols were used in the preparation:

B1: glycerine-dimethacrylate (Blemmer GMR commercially avaible from Nippon Oil and Fats)

B2: ethoxyalted methacrylic acid having an OH-content of 5.75%

B3: 2-hydroxy-3-(methacryloyloxypropyl)trimethyl ammonium chloride

B4: sodium salt of 2-hydroxy-sulphonic acid

B5: ethoxylated 3-hydroxypropyl-sulphonic acid sodium salt having an OH-number of 80.

B6: First propoxylated and then ethoxylated (EO:PO=7:1) 3-hydroxypropyl-sulphonic acid sodium salt having an OH number of 28.

B7: 2-[(2'-dimethylamino)ethoxy]ethanol

B8: cetylalcohol

B9: dodecanol

B10: mixed glycerine ester of acrylic and methacrylic acid (Blemmer GAM commercially available from Nippon Oil and Fats)

The monomer mixtures listed in table 1 were prepared according to the following general procedure: A polyisocyanate A, 600 ppm Sn(II)-isooctanoate based on the amount of alcohol and polyisocyanate and 1000 ppm 2,6-di-tert-butylcresol based on the amount of alcohol and polyisocyanate are brought in butanon at room temperature. To this mixture is then added dropwise during 20 min. an alcohol B and subsequently the mixture was heated to 60° C. This heating was continued untill all isocyanate groups were reacted (as monitored by the isocyanate band in the IR-spectrum of the polyisocyanate) when an equivalent of hydroxyl and isocyanate groups was used in the reaction mixture. In case the amount of alcohol was such then less OH-groups were present then isocyanate groups, the reaction was continued untill the isocyanate-content remained constant. A second alcohol was then added dropwise during 30 min. and the mixture was then stirred untill all isocyanate groups were reacted.

The detailed reaction conditions for obtaining the mixtures listed in table 1 are as follows:

| No. Table 1 | polyisocyanate A | butanon | alcohol B | stirring |
|---|---|---|---|---|
| 1 | 63.42 g A3 =0.24 mol NCO | 250 ml | 53.73 g B1 =0.24 mol OH | 20 h |
| 2 | 60.49 g A2 =0.24 mol NCO | 250 ml | 53.73 g B1 =0.24 mol OH | 19 |
| 3 | 60.49 g A2 =0.24 mol NCO | 250 ml | 35.36 g B2 =0.12 mol OH | 0.5 h |
|   |   |   | 28.86 g B1 =0.12 mol OH | 26 h |
| 4 | 60.49 g A2 =0.24 mol NCO | 250 ml | 35.82 g B1 =0.16 mol OH | 1 h |
|   |   |   | 19.02 g B3 =0.08 mol OH | 42 h |
| 5 | 75.62 g A2 =0.3 mol NCO | 250 ml | 33.58 g B1 =0.15 mol OH | 2 h |
|   |   |   | 35.66 g B3 =0.15 mol OH | 18 h |
| 6 | 75.62 g A2 =0.3 mol NCO | 250 ml | 22.39 g B1 =0.10 mol OH | 2 h |
|   |   |   | 47.45 g B3 =0.20 mol OH | 24 h |
| 7 | 50.42 g A4 =0.24 mol NCO | 250 ml | 53.73 g B1 =0.24 mol OH | 22 h |
| 8 | 58.28 g A1 =0.3 mol NCO | 250 ml | 44.77 g B1 =0.2 mol OH | 1 h |
|   |   |   | 14.81 g B4 =0.1 mol OH | 182 h |
| 9 | 36.22 g A2 =0.15 mol NCO | 160 ml | 22.38 g B1 =0.1 mol OH | 2 h |
|   |   |   | 34.70 g B5 =0.05 mol OH | 72 h |
| 10 | 56.37 g A2 =0.23 mol NCO | 250 ml | 33.57 g B1 =0.15 mol OH | 2.5 h |
|   |   |   | 154.30 g B6 =0.08 mol OH | 76 h |
| 11 | 58.28 g A1 =0.3 mol NCO | 250 ml | 44.77 g B1 =0.2 mol OH | 1 h |
|   |   |   | 13.22 g B7 =0.1 mol OH | 19 h |
| 12 | 58.28 g A1 =0.3 mol NCO | 250 ml | 44.77 g B1 =0.2 mol OH | 1 h |
|   |   |   | 24.25 g B8 =0.1 mol OH | 21 h |
| 13 | 58.28 g A1 =0.3 mol NCO | 250 ml | 48.70 g B1 =0.21 mol OH | 1 h |
|   |   |   | 16.77 g B9 =0.09 mol OH | 35 h |
| 14 | 58.28 g A1 =0.3 mol NCO | 250 ml | 55.66 g B1 =0.24 mol OH | 1 h |
|   |   |   | 11.18 g B9 =0.06 mol OH | 59 h |

The products listed in table 2 were prepared as follows. 2.5 VAL of polyisocyanate A5 were mixed with a polyethyleneoxide polyether C having a hydroxy and a methoxy end group (see next table) and subsequently stirred at 100° C. for 2.5 hours. A polyisocyanate D was thus obtained (see next table). This polyisocyanate D was then brought in 250 ml of butanone together with 600 ppm Sn(II)-isooctanoate based on the amount of polyisocyanate and alcohol and 1000 ppm of 2,6-di-tert.butyl-cresol based on the amount of polyisocyanate and alcohol. During 20 min. was then dropwise added alcohol B (see next table) and the mixture was subsequently heated at 60° C. untill all isocyanate groups were reacted.

| Nr. in Tab. 2 | POLYETHER C (VAL) | POLYETHER C M(g/mol) | POLYISOCYANAT D Am. | POLYISOCYANAT D C(EO) | ALKOHOL B visco. | ALKOHOL B Am. | stirring |
|---|---|---|---|---|---|---|---|
| 15 | 0.24 | 350 | 60.38 g | 13.5% | 300 mPas | 53.73 g B1 | 22 h |
| 16* | 0.07 | 1210 | 56.02 g | 13.6% | 315 mPas | 53.73 g B1 | 22 h |
| 17 | 0.13 | 350 | 54.80 g | 8.2% | 285 mPas | 53.73 g B1 | 20 h |
| 18 | 0.10 | 750 | 57.76 g | 6.7% | 300 mPas | 53.73 g B1 | 20 h |
| 19 | 0.15 | 750 | 62.63 g | 9.6% | 330 mPas | 53.73 g B1 | 25 h |
| 20 | 0.15 | 750 | 62.63 g | 9.6% | 330 mPas | 51.41 g B10 | 40 h |
| 21 | 0.15 | 750 | 62.63 g | 9.6% | 330 mPas | 70.93 g B2 | 18 h |

(*)the methoxy end group of polyether C was replaced with the following endgroup:

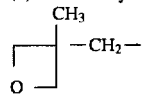

In the above table, C(EO) represents the amount of ethyleneoxide units in polyisocyanate D in % by weight. M is the molecular weight of polyether C. For the reaction of polyisocyanate D with alcohol B the amounts given for each are such that the amount of NCO and OH are 0.24 mol.

The photopolymerizable composition in connection with the present invention may comprise additional monomers other than those according to the mixture of general formula (I). Suitable monomers to be mixed with the monomer mixture according to the invention are e.g. the urethane type monomers disclosed in EP-A-502562, unsaturated esters of polyols, particularly such esters of the alpha-methylene carboxylic acids, e.g. ethylene diacrylate, glycerol tri-(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, 1,5-pentanediol di(meth)acrylate, the bis acrylates and methacrylates of polyethylene glycols of molecular weight 200–500, and the like: unsaturated amides, (particularly those of the alphamethylene carboxylic acids, and especially those of alpha-omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated aldehydes, e.g. sorbaldehyde (hexadienal). It is also possible to add polymers and/or oligomers comprising 2 or more polymerizable functions e.g. acrylated epoxies, polyester acrylates, urethane acrylates etc . . .

The amount of monomers corresponding to the monomer mixture of general formula (I) and optionally comonomers as described above may be varied according to the kind of application.

The photopolymerizable composition used in accordance with the present invention preferably comprises at least one photoinitiator. Preferably used photoinitiators are polymerization initiators activatable by actinic light and thermally inactive at and below 185° C. Examples of such initiators include the substituted or unsubstituted polynuclear quinones which are compounds having two intracyclic carbonyl groups attached to intracylic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methylanthraquinone, 2-tert-butylanthraquinone, octamethylanthraquinone, 1,4-naphtoquinone, 9,10-phenanthrenequinone, 1-2 benzanthraquinone, 2,3-dichloronaphthoquinone, sodium salt of anthraquinone alpha-sulfonic acid, 3-chloro-2-methylanthraquinone, and 1,2,3,4-tetrahydrobenzene a anthracene-7,12-dione. The photointiators which are also useful are described in Plambeck U.S. Pat. No. 2,760,863 and include vicinal ketaldonyl compounds, such as diacetyl, benzil, etc. alpha-ketaldonyl alcohols, such as benzoin, pivalon, etc. acyloin ethers e.g. benzoin methyl and ethyl ethers, etc.; alpha-hydrocarbon substituted aromatic acyloins, including mehtylbenzoin, alpha-allylbenzoin, and alpha-phenylbenzoin. Still further photoinitiators useful in accordance with the present invention are those disclosed in "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol.59,N° 751, August 1987, pages 97–106, in EP-A 362,827, and in U.S. Pat. No. 3,558,309. Suitable water soluble or water dispersable initiators are e.g. Quantacure QTX and Quantacure BTC from Ward & Blenkinsop (UK) or Darocure 2959 from Merck.

According to the present invention thermal polymerization inhibitors may also be added to the photopolymerizable composition. Inhibitors for use in accordance with the present invention are p-methoxyphenol, hydroquinone, alkyl and acyl-substituted hydroquinones and quinones, tert-butylcatechol, pyrogallol, copper resinate, naphtylamines, beta-naphtol, cuprous cloride, 2,6-di-tert-butyl p-cresol, photothiazine, pyridine, nitrobenzene and dinitrobenzene, p-toluquinone and chloranil.

Various dyes, pigments, thermographic compounds, UV-absorbers, anti-oxidants and color forming components can be added to the photopolymerizable compositions or another layer of the imaging element to give a variety of results. These additive materials, however, preferably should not absorb excessive amounts of light at the exposure wavelength or inhibit the polymerization reaction.

Among the dyes useful in the invention are Fuchsine (C.I. 42510), Auramine Base (C.I. 410003), Calcocid Green S (C.I. 44000), Para Magenta (C.I. 42500), Tryparosan (C.I. 42505), New Magenta (C.I. 42520), Acid Violet RRL (C.I. 42425), Red Violet 5RS (C.I. 42960), C.I. Solvent Blue 36 (C.I. 61551), Nile Blue 2B (C.I. 51185), New Methylene BLue GG (C.I. 51195), C.I. Basic Blue 20 (C.I. 42585, Iodine Green (C.I. 42556), Night Green B (C.I. 42415), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphtalene Black 12R (C.I. 20350), Fast Black L (C.I. 51215), and Ethyl Violet (C.I. 42600).

Suitable pigments include, e.g. $TiO_2$, colloidal carbon, graphite, phosphor particles, ceramics, clays, metal powder such as aluminium, copper, magnetic iron and bronze, etc. The pigments are useful when placed in the photosensitive layer or in an adjacent non-photosensitive layer e.g. an anti-halation layer or (a) layers improving the adherence between the support and the photosensitive layer.

Useful thermographic additives, e.g. 3 cyano-4,5-dimethyl-5-hydroxy-3-pyrrolin-2-one, and activators, e.g. copper acetate, are disclosed in the application of Holland and Wayrynen, Ser. No. 807,761, filed Apr. 21, 1959, and the following U.S. Pat. Nos.: 2,825,494, 2,637,657, 2,665,654, 2,663,655, 2,663,656, and 2,663,657.

The photosensitive layer of the imaging element in connection with the present invention will preferably also include a polymeric binder that can be thermoplastic or not depending on the type of application. Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

Suitable non-thermoplastic polymeric compounds include polyvinyl alcohol, cellulose, anhydrous gelatin, phenolic resins and melamine-formaldehyde resins, etc.

If desired, the photosensitive layer(s) can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the photosensitive layer. The fillers are useful in improving the strength of the composition, reducing tack and in addition, as coloring agents.

Agents to improve the wetting and/or adjust the adhesion of the photosensitive layer may be added. Suitable agents are e.g. silicons, silicon containing polymers e.g. a poly(dimethylsiloxane)-polyether copolymer, poly(dimethylsiloxane)-polyester, silicon containing surfactants, fluor containing copolymers and fluor containing surfactants etc . . .

The imaging element in connection with the present invention may further include additional layers e.g. to improve the adhesion of the photosensitive layer to the support or underlying layers, a protective layer etc . . . It is particularly advantageous to include a base layer, containing a polymer containing polymerizable groups, adjacent to the photosensitive layer. Examples of polymers containing polymerizable groups are polymers comprising vinyl groups, allyl groups, (meth)acrylate groups, butadiene groups, isoprene groups etc., e.g. acrylated epoxies, polyester acrylates, urethane acrylates etc . . .

Said polymers containing polymerizable groups may be prepared by modification of polymers e.g. modification of polymers containing hydroxyl groups e.g. polyvinyl alcohol, polyesters with hydroxyl functions, copolymers of styrene and allylalcohol, phenoxy resins, cellulose, dextranes etc. with carboxilic acid or acid halides, modification of polymers containing epoxy groups with diallylamine, modification of polymers containing amino groups, isocyanate groups, anhydride groups, alkyl chloride groups, silanol groups etc . . . Suitable supports of the imaging element for use in accordance with the present invention are e.g. polyester film supports e.g. polyethylene terephthalate, glass, wood, paper, polyethylene coated paper, cellulose esters e.g. cellulose acetate, cellulose propionate, cellulose butyrate, poly carbonate, polyvinyl chloride, polyimide, polypropylene etc.

According to the method of present invention for obtaining an image the imaging element is image-wise exposed and subsequently developed. The imaging element in connection with the invention is preferably exposed to an image-wise distribution of actinic radiation to harden said photopolymerizable composition pattern-wise in correspondence to said image-wise distribution of actinic radiation. The exposure can be a contact exposure using e.g ultraviolet radiation, a camera exposure, a scanning exposure, or a laser exposure. The radiation source used in carrying out the exposure step includes e.g. sunlight, incandescent lamps, mercury vapor lamps, halogen lamps, xenon lamps, fluorescent lamps, light-emitting diodes, lasers, electron rays, and X-rays.

Alternatively the image-wise exposure can be an exposure to heat e.g. by means of a thermal head.

Development of the imaging element may be carried out by using a developer capable of dissolving the insufficient or non-hardened parts of the photosensitive layer. For ecological reasons and/or convenience a dry development step is preferred.

Such dry development step can be an overall heating of the imaging element when the image-wise exposure was in the form of actinic radiation or it can be an overall exposure when the image-wise exposure was in the form of heat. Dry development may also be carried out by delaminating the exposed and non-exposed parts of the photosensitive layer using a stripping layer wherein the exposed and non-exposed parts selectively adhere to either the stripping layer or base of the imaging element. Such delamination can also be combined with heat development.

Thus according to a preferred method for obtaining an image an imaging element containing a photosensitive layer in accordance with the present invention can be image-wise exposed to actinic radiation and subsequently or simultaneously heated whilst in contact with an image receiving material. The insufficient or non-exposed parts of the photosensitive layer will thereby be transferred to the image receiving material so that after peeling both elements apart an image is obtained on the receiving material as well as on the imaging element.

Preferred imaging elements for use in this method are imaging elements containing on a support stable at the temperatures used for overall exposure a thermoplastic photosensitive layer that is preferably solid at temperatures below 40° C. and is transferable in the non-exposed or insufficiently exposed parts at temperatures between 40° C. and 250° C.

The receiving material to which the image is transferred must also be stable at the process temperature. The particular material used is dependent on the adhesion of the image to the support of the imaging element. Suitable receiving materials include paper, cardboard, metal sheets foils and meshes e.g. aluminium, copper, steel, bronze etc., polyethylene, polyester film supports e.g. polyethylene terephthalate, opaque foamed or pigmented polyester, cellulose esters, silk, cotton, viscose rayon fabrics or screens, polycarbonate, polyvinyl chloride, polypropylene, polyethylene coated paper.

The surface of the receiving material may be a hydrophilic surface, a layer showing preferential adhesion towards the non-exposed parts of the layer containing the photopolymerizable composition or contain on its surface compounds that react with compounds being transferred so as to produce difference in color, hydrophilicity, conductivity etc. at the surface of the receiving material corresponding to the exposed and non-exposed parts.

The imaging element and receiving material may also be brought in contact before exposure or may be present in one element. Such an element is called a monosheet material and requires that either its back or its front is transparant for the radiation used for the exposure of the photopolymerizable composition.

In an especially preferred variant the receiving material contains a hydrophilic surface. Transfer of the non-exposed or insufficiently exposed parts of the photopolymerizable composition to a receiving material having a hydrophilic surface will thus result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

After transfer of the non-exposed or insufficiently exposed parts of the photopolymerizable composition to the receiving material it may be advantageous to overall expose the transferred image to light and/or heat to enhance the stability of the transferred image. Such a procedure is especially preferably when the transferred image is used as a printing master as described above.

Receiving materials having a hydrophilic surface are e.g. metal supports like Al or Zn, polyester film supports and paper bases. These supports, if not sufficient hydrophilic by themselves, are first coated with a hydrophilic layer. A particularly suitable hydrophilic layer is a layer of polyvinyl alcohol hardened with a tetraalkyl orthosilicate e.g. tetramethylorthosilicate or tetraethylorthosilicate containing $TiO_2$ as disclosed in e.g. U.S. Pat. No. 3,971,660.

A preferably used metal support is aluminium. Suitable aluminium supports for use in accordance with the present invention are aluminium foils made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a center line average value expressed in µm and preferably varies from about 0.2 to about 1.5 µm.

The anodization of the aluminium foil can be performed in electrolytes e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.0 µm.

To promote the image sharpness and, as a consequence thereof, the sharpness of the final printed copy, the anodization layer may be coloured in the mass with an antihalation dye or pigment e.g. as described in JA-A 58-14797. The dye or pigment or a combination of dyes or pigments used for such colouring in the mass are chosen such that they prevent or reduce halation in the layer comprising the polymer containing aryldiazosulfonates.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70–100° C. or with steam. The hot sealing water may comprise additives e.g. nickel salts to improve the sealing effect. The sealing can also be performed by treatment of the anodic surface with an aqueous solution comprising phosphate ions or silicates. Thanks to the sealing treatment the anodic layer is rendered substantially nonporous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. Pat. No. 3,861,917 and in the documents referred to therein.

The thermal transfer method described above can also be employed for producing an electrostatic printing master. According to this mode the image-wise exposed photopolymerizable composition used in accordance with the present invention is transferred to a receiving material having a conductive surface or a surface containing compounds that react with compounds being transferred so as to produce an image-wise differentiation in conductivity. Preferably a receiving material carrying a conductive surface e.g. a polyethylene terephthalate support provided with a metallic layer of e.g. aluminium is used. After the transfer of the image-wise exposed photopolymerizable composition to such a material the parts where no transfer took place, corresponding to the exposed parts of the photopolymerizable composition contained in the imaging element, remain conductive while the other parts have become non-conductive. An electrostatic printing master can thus be obtained.

The receiving material may be a support provided with a metal layer e.g. copper. A printed circuit can thus be produced in a subsequent etch treatment where the image-wise transferred photopolymerizable composition serves as a resist.

According to further embodiment of a thermal transfer method as described above color images can be prepared. According to this mode at least three imaging elements comprising respectively a yellow, magenta and cyan dye or dye pigment in a photopolymerizable composition used in accordance with the present invention, are image-wise exposed with respectively the blue, green and red color selection of the image. Optionally a fourth imaging element comprising a black dye or dye pigment can be used. Each of these imaging elements is successively heated in contact with the same receiving material e.g. a paper material to allow the transfer of each of the different color selections of the image. It is obvious that the transfer of the different color parts of the image must be carried out in register to obtain a faithful reproduction of the original image.

According to another variant a porous layer of an image forming material may be provided on top of the photosensitive layer so that at the non-exposed or insufficient exposed areas of the imaging element the porous layer is transferred together with the photosensitive layer to the image receiving material. By the term porous layer in connection with the present invention is meant a layer consisting mainly of particles of image forming material and that may contain a binder upto 30% by weight of the total amount of solids in the porous layer. Examples of suitable image forming pigments are e.g. the pigments mentioned above in particular carbon black. It will further be understood that in case the porous layer is not sufficiently transparant to allow image-wise exposure by actinic radiation thereto said image-wise exposure should then be performed through the back of a transparant support.

A photopolymerizable composition in connection with the present invention can also be used in an imaging element having separated from each other a dye precursor e.g. a leucodye and a developer that when brought in reactive association with the dye precursor develops a color. The dye precursor and developer can be separated from each other by providing them in different layers. By applying heat to the imaging element the dye precursor and developer can be brought in reactive association with each other to form a color. A photopolymerizable composition in accordance with the invention can be added to one or both of these layers or it may be provided between both layers.

Image-wise exposure to actinic radiation of such imaging element will harden the photopolymerizable composition at the exposed parts and consequently immobilize the dye precursor and/or developer. When the imaging element is subsequently overall heated a color will only develop at the non-exposed parts.

Alternatively the image-wise exposure may be a heat exposure so that at the exposed parts dolor is developed. A subsequent overall exposure to actinic radiation will then stabilize the image since it will inhibit diffusion of the dye precursor to the developer or vice versa at the areas not exposed by heat.

Suitable dye precursors are for example triarylmethanelactone compounds such as 3,3-bis(p-dimethylaminophenyl)-6-dimethylaminophthalide, 3,3-bis(p-dimethylaminophenyl)phthalide, 3-(p-dimethylaminophenyl)3-(1,2-dimethylindole-3-yl)phthalide, 3-(p-dimethylaminophenyl)-3-(2-methylindole-3-yl)phthalide, 3,3-bis(1,2-dimethylindole-3-yl)-5-dimethylaminophthalide, 3,3-bis(1,2-dimethylindole-3-yl)-6-dimethylaminophthalide, 3,3-bis(9-ethylcarbazole-3-yl)-6-dimethylaminophthalide, 3,3-bis(2-phenylindole-3-yl)-6-dimethylaminophthalide, 3-p-dimethylaminophenyl-3-(1-methylaminophthalide and the like; diphenylmethane compounds such as 4,4bis-dimethylaminobenzhydryl benzyl ether, N-halophenyl-leucoauramine, N-2,4,5-trichlorophenyl-leucoauramine and the like; thiazine compounds such as benzoyl-leucomethylene bleu, p-nitrobenzoylleucomethylene blue and the like; spiro compounds such as 3-methylspiro-dinaphthopyran, 3-ethyl-spiro-dinaphthopyran, 3-benzyl-spirodinaphthopyran, 3-methyl-naphtho-(6-methoxybenzo)spiropyran, 3-propyl-spiro-dibenzopyran and the like; lactam compounds such as Rhodamine-B anilinelactam, Rhodamine(p-nitroanilino)lactam, Rhodamine(o-chloroanilino)lactam and the like; and fluoran compounds such as 3-dimethylamino-7methoxyfluoran, 3-diethylamino-6-methoxyfluoran, 3-diethylamino-7-methoxyfluoran, 3-diethylamino-6-methyl-7-chlorofluoran, 3-diethylamino-6,7-dimethylfluoran, 3-(N-ethyl-p-toluidino)-7-methylfluoran, 3-diethylamino-7-N-acetyl-N-methylaminofluoran, 3-diethylamino-7-N-methylaminofluoran, 3-diethylamino-7-dibenzylamino-7-N-methyl-N-benzylaminofluoran, 3-diethylamino-7-N-chloroethyl-N-methylaminofluoran, 3-diethylamino-7-N-diethylaminofluoran, 3-(N-ethyl-p-toluidino)-6-methyl-7-phenylaminofluoran, 3-(N-ethyl-p-toluidino)-6-methyl-7-(p-toluidino)-fluoran, 3-diethylamino-6-methyl-7-phenylaminofluoran, 3-di-n-butylaminofluoran, 3-diethylamino-7-(2-carbomethoxyphenylamino)fluoran, 3-(N-cyclohexyl-N-methylamino)-6-methyl-7-phenylaminofluoran, 3-(N-cyclopentyl-N-methylamino)-6-methyl-7-phenylaminofluoran, 3-(N-cyclopentyl-N-ethylamino)-6-methyl-7-phenylaminofluoran, 3-(N-cyclohexyl-N-ethylamino)-6-methyl-7-phenylaminofluoran, 3-(N-3',3',5'-trimethylcyclohexyl-N-methylamino)-6-methyl-7-phenylaminofluoran, 3-pyrrolidino-6-methyl-7-phenylaminofluoran, 3-piperidino-6-methyl-7-phenylaminofluoran, 3-diethylamino-6-methyl-7-xylidinofluoran, 3-diethylamino-7-(o-chlorophenylamino)-fluoran, 3-dibutylamino-7-(o-chlorophenylamino)fluoran, 3-pyrrolidino-6-methyl-7-p-butylphenyl aminofluoran, 3-diethylamino-7-(o-fluorophenylamino)fluoran, 3-dibutylamino-7-(o-fluorophenylamino)fluoran, 3-(N-methyl-N-n- amyl)amino-6-methyl-7-phenylaminofluoran, 3-(N-ethyl-N-n-amyl)amino-6-methyl-7-phenylaminofluoran, 3-(N-methyl-N-n-hexyl)amino-6-methyl-7-phenylaminofluoran, 3-(N-ethyl-N-n-hexyl)amino-6-methyl-7-phenyaminofluoran, 3-(N-ethyl-N-6-ethylhexyl)-amino-6-methyl-7-phenylaminofluoran, 3-(N-ethyl-N-tetrahydrofurfurylamino)-6-methyl-7-phenylfluoran and the like. Still further dye precursors are disclosed in e.g. U.S. Pat. No. 4,803,148, EP-A-302529, DE-A-3.807.744, DE-A-3.942.227, DE-A-3.810.207, U.S. Pat. No. 4,753,759 and the references cited therein. The dye precursors may be used either solely or in combination.

Among the color developers, there are many acidic compounds which develop a color by contacting with the above dye precursors, for example, phenolic compounds such as 4-tert-butylphenol, α-naphthol, β-naphtol, 4-acetylphenol, 4-phenylphenol, hydroquinone, 4,4'-isopropylidenediphenol(bisphenol A), 2,2'-methylenebis(4-chlorophenol), 4,4'-cyclohexylidenediphenol, 4,4'-dihydroxydiphenylsulfide, hydroquinone monobenzyl ether, 4-hydroxybenzophenone, 2,4-dihydroxybenzophenone, 2,4,4'-trihydroxybenzophenone, 2,2',4,4'-tetrahydroxybenzophenone, dimethyl 4-hydroxyphthalate, methyl 4-hydroxybenzoate, ethyl 4-hydroxybenzoate, propyl 4-hydroxybenzoate, sec-butyl 4-hydroxybenzoate, pentyl, 4-hydroxybenzoate, phenyl 4-hydroxybenzoate, benzyl 4-hydroxybenzoate, tolyl 4-hydroxybenzoate, chlorophenyl 4-hydroxybenzoate, phenylpropyl 4-hydroxybenzoate, phenetyl 4-hydroxybenzoate, p-chlorobenzyl 4-hydroxybenzoate, p-methoxybenzyl 4-hydroxybenzoate, novolak phenol resin, phenol polymers and the like; aromatic carboxylic acids such as benzoic acid, p-tert-butylbenzoic acid, trichlorobenzoic acid, terephthalic acid, 3-sec-butyl-4-hydroxybenzoic acid, 3-cyclohexyl-4-hydroxybenzoic acid, 3,5-dimethyl-4-hydroxybenzoic acid, salicylic acid, 3-isopropylsalicylic acid, 3-benzylsalicylic acid, 3-(α-methylbenzyl)salicylic acid, 3-chloro-5-(α-methylbenzyl)salicylic acid, 3,5-di-tert-butylsalicylic acid, 3-phenyl-5-(α,α-dimethylbenzyl)salicylic acid, 3,5-di(α-methylbenzyl)salicylic acid and the like; and salts of the above phenolic compounds or aromatic carboxylic acids with polyvalent metals such as zinc, magnesium, aluminium, calcium, titanium, manganese, tin and nickel.

There can further be used 4-hydroxydiphenylsulfone derivatives such as 4,4'-dihydroxydiphenylsulfone, 3,3'-dipropenyl-4,4'-dihydroxydiphenylsulfone, 4-hydroxy-4'-chlorodiphenylsulfone, 4-hydroxy-4'-methyldiphenylsulfone, 4-hydroxy-3'4'-dimethyldiphenylsulfone, 4-hydroxy-4'-ethyldiphenylsulfone, 4-hydroxy-4'-tert-butyldiphenylsulfone, 4-hydroxy-4'-n-octyldiphenylsulfone, 4-hydroxy-4'-n-octyldiphenylsulfone, 4-hydroxy-4'-methoxydiphenylsulfone, 4-hydroxy-4'-ethoxydiphenylsulfone, 4-hydroxy-4'-isopropyloxydiphenylsulfone, 4-hydroxy-4'-n-butoxy-diphenylsulfone, 4-hydroxy-4'-tertbutoxydiphenylsulfone, 4-hydroxy-4'-isoamyloxydiphenylsulfone, 4-hydroxy-4'-n-octyloxydiphenylsulfone, 4-hydroxy-4'benzyloxydiphenylsulfone, 4-hydroxy-4'-phenoxydiphenylsulfone, 3',4'-trimethylene-4-hydroxydiphenylsulfone, 3',4'-trimethylene-2,6-dimethyl-4-hydroxydiphenylsulfone, 3',4'-tetramethylene-4-hydroxydiphenylsulfone, 3',4'-tetramethylene-2-methyl-4-hydroxydiphenylsulfone and the like.

4-hydroxybenzenesulfonylnaphthalenes may be used as color developers. They include 1-(4-hydroxybenzenesulfonyl)naphthalene, 1-(4-hydroxybenzenesulfonyl)-4-methylnaphthalene, 1-(4-hydroxybenzenesulfonyl)-4-methoxynaphthalene, 1-(4-hydroxybenzenesulfonyl)-4-chloronaphthalene, 1-(4-hydroxy-2-methylbenzenesulfonyl)naphthalene, 1-(4-hydroxy-2-chlorobenzenesulfonyl)naphthalene, 1-(4-hydroxybenzenesulfonyl)-2,-dimethylnaphthalene, 1-(4hydroxybenzenesulfonyl)-4-hydroxynaphthalene, 1-(4-hydroxybenzenesulfonyl)-2-hydroxynaphthalene, 1-(4-hydroxy-2-isopropylbenzenesulfonyl)naphthalene, 1-(4hydroxy-2-isoamylbenzenesulfonyl)naphthalene, 1-(4-hydroxy-2-isopropyloxybenzenesulfonyl)-naphthalene, 1-(4-hydroxybenzenesulfonyl)-4-tert-butoxynaphthalene, 1-(4-hydroxy-2-benzyloxybenzenesulfonyl)naphthalene, 1-(4-hydroxy-2-phenoxybenzenesulfonyl)naphthalene, 2-(4-hydroxybenzene sulfonyl)naphthalene and the like.

Halophthalic acid monoesters can also be used. Examples are monomethyl ester, monoethyl ester, monocyclopentyl ester, monoallyl ester, monobenzyl ester, mono-p-methylbenzyl ester, mono-p-chlorobenzyl ester, monophenethyl ester, monophenyl ester, mono-p-methylphenyl ester, mono-2,4-dimethylphenyl ester, mono-p-chlorophenyl ester, mono-p-ethoxyphenyl ester, mono-1-naphthyl ester, mono-2-naphthyl ester, mono-2-hydroxyethyl ester, mono-2-hydroxybutyl ester, mono-3-hydroxybutyl-2-ester, mono-2-(2-hydroxyethoxy)ethyl ester, mono-2-hydroxypropyl ester, mono-4-hydroxybutenyl ester, mono-4-hydroxybutyl ester, mono-2-hydroxycyclohexyl ester, mono-4-hydroxycyclohexyl ester and mono-2,3-dihydroxypropyl ester of halophthalic acids, such as 4 (or 5)-fluorophthalic acid, 4 (or 5)-chlorophthalic acid, 4 (or 5)-bromophthalic acid, 3,6 (or 4,5)-dicholorophthalic acid, 3,6 (or 4,5) -dibromophthalic acid, 3,4,5,6-tetrafluorophthalic acid, 3,4,5,6,-tetra chloropthalic acid, 3,4,5,6-tetrabromophthalic acid and the like. Among the polyvalent metal compounds which form polyvalent metal salts with the above esters, there are included magnesium, calcium, barium, zinc, aluminium, tin, iron, cobalt, nickel and the like. Preferable metals are magnesium, calcium, barium and zinc.

Further suitable color developers are disclosed in e.g. U.S. Pat. No. 4,803,148, EP-A-302529, DE-A-3.807.744, DE-A-3.942.227, DE-A-3.810.207, U.S. Pat. No. 4,753,759 and the references cited therein.

The present invention will now be illustrated by the following examples without however limiting it thereto. All parts are by weight unless otherwise specified.

EXAMPLE 1

To a polyester film serving as a stripping layer in the image forming process and having a thickness of 5 μm were applied in the order given the following 3 layers using gravure printing:
1) a subbing layer containing a copolyester of isophtalic acid (40 mol % of the total amount of acid), terephthalic acid (53 mol % of the total amount of acid), sulphoisophtalic acid sodium salt (7 mol % of the total amount of acid) and ethylene glycol at a dry thickness of 0.13 g/m$^2$
2) a base layer containing polyvinyl alcohol of which 25 mol % of the hydroxyl groups were modified with methacryloyl chloride to a dry layer thickness of 1 g/m$^2$
3) a photosensitive layer having a total layer thickness of 4.3 g/m$^2$ and containing monomer mixture 1 mentioned above in an amount of 2.38 g/m$^2$, bis-imidazol in an amount of 1.64 g/m$^2$, mercapto benzoxazole in an amount of 0.096 g/m$^2$, Michlers keton in an amount of 0.048 g/m$^2$ and a blue dye (C.I. 61551) in an amount of 0.14 g/m$^2$.

To a support consisting of a polyester film having a thickness of 100 μm were simultaneously coated using slide hopper coating in the order given an aqueous dispersion containing 4% of carbon black, 0.8% of polyvinyl pyrrolidone and 0.6% of a wetting agent at a dry layer thickness of 1 g/m$^2$ and an aqueous solution containing 1.5% of gelatin at a dry layer thickness of 0.2 g/m$^2$.

Both elements were subsequently laminated to each other in a LPP 650 laminator (commercially available from Domed) at a temperature of 60° C. and a rate of 0.6 m/min.

The thus obtained imaging element was information-wise exposed through the polyester film stripping layer of 5 μm in a Dupliphot apparatus (commercially available from Agfa-Gevaert N.V.) with an output of 200 illumination units. The information-wise exposed imaging element was subsequently guided through the above mentioned LPP 650 laminator at 70° C., a rate of 0.6 m/min. The polyester film stripping layer was then peeled off and an image of high quality was obtained on the support.

EXAMPLES 2–10

Imaging elements 2 to 10 were prepared as described in example 1 with the exception that respectively monomer mixtures 2,4,7,9,10,11,13,14 and 17 were used instead of monomer mixture 1. An image of good quality could be obtained with each of the imaging elements.

EXAMPLE 11

Preparation of a Receiving Element

To 418 g of a dispersion containing 21.5% of $TiO_2$ (average particle size 0.3 to 0.5 μm) and 2.5% of polyvinyl alcohol in deionized water were subsequently added, while stirring, 220 g of a 5% polyvinyl alcohol solution in water, 95 g of a hydrolyzed 22% tetramethyl orthosilicate emulsion in water and 22 g of a 10% solution of a wetting agent. To this mixture was then added 245 ml of deionized water and the pH was adjusted to pH=4.

The resulting dispersion was coated on a polyester (coated with a hydrophilic adhesion layer) support to a wet coating thickness of 55 $g/m^2$ and dried at 30° C.

Preparation of an Imaging Element

To a polyester film serving as a stripping layer in the image forming process and having a thickness of 5 μm were applied in the order given the following 3 layers using gravure printing:
1) a subbing layer containing a copolyester of isophtalic acid (40 mol % of the total amount of acid), terephthalic acid (53 mol % of the total amount of acid), sulphoisophtalic acid sodium salt (7 mol % of the total amount of acid) and ethylene glycol at a dry thickness of 0.13 $g/m^2$
2) a base layer containing polyvinyl alcohol of which 25 mol % of the hydroxyl groups were modified with methacryloyl chloride to a dry layer thickness of 1 $g/m^2$
3) a photosensitive layer having a total layer thickness of 4.3 $g/m^2$ and containing monomer mixture 1 mentioned above in an amount of 2.38 $g/m^2$, bis-imidazol in an amount of 1.64 $g/m^2$, mercapto benzoxazole in an amount of 0.096 $g/m^2$, Michlers keton in an amount of 0.048 $g/m^2$ and a blue dye (C.I. 61551) in an amount of 0.14 $g/m^2$.

Preparation of a Lithographic Printing Plate

The imaging element described above was placed in contact with a test target and exposed therethrough to ultraviolet radiation. The exposed imaging element was then placed in face-to-face contact with a hydrophilic receiving material prepared as described above. The contacting elements were conveyed through a roll laminator device at about 80° C. and a speed of 0.6 m/min. Nexts, the elements were peeled apart.

The thus obtained printing plate was overall exposed to UV-radiation to harden the transferred parts of the photosensitive layer. Subsequently the printing plate could be used to print on a conventional offset press using a commonly employed ink and fountain. Good copies were obtained.

EXAMPLES 12–15

Printing plates were prepared as described in example 11 with the exception that the monomer mixture 1 was replaced with respectively monomer mixture 2,11,14 and 17. In each case a printing plate of good quality was obtained.

EXAMPLE 16

A lithographic printing plate was prepared as in example 1 with the exception that the image receiving material was replaced by the following image receiving material. The transfer temperature used was 90° C. instead of 80° C.

An aluminium foil having a thickness of 0.15 mm was grained, anodized, and sealed according to the method described in Example 1 of U.S. Pat. No. 3,861,917. The centre line average value obtained by the graining was 0.5 μm. An aluminium support having an anodization layer of a weight of 2.7 g per $m^2$ is thus obtained.

A lithographic printing plate yielding good copies could be obtained.

EXAMPLE 17

To a polyester film having a thickness of 100 μm was applied a photosensitive layer having a total layer thickness of 4.3 $g/m^2$ and containing monomer mixture 4 mentioned above in an amount of 2.38 $g/m^2$bis-imidazol in an amount of 1.64 $g/m^2$, mercapto benzoxazole in an amount of 0.096 $g/m^2$ and Michlers keton in an amount of 0.048 $g/m^2$.

The thus obtained imaging element was image-wise exposed in a Dupliphot apparatus (commercially available from Agfa-Gevaert NV) with an output of 200 illumination units. The image-wise exposed imaging element was subsequently developed with methylethyl ketone for 15s and subsequently dried. The obtained image was of good quality and the required energy to obtain the image was 10 $J/m^2$.

EXAMPLES 18 and 19

Imaging elements were prepared as in example 17 with the exception that respectively monomer mixtures 9 and 10 were used instead of monomer mixture 4. The imaging elements were processed as in example 17 to obtain images of good quality. The required energies to obtain these images was respectively 0.7 $J/m^2$ and 0.9 $J/m^2$.

EXAMPLES 20 and 21

Imaging elements were prepared as in example 17 with the exception that respectively monomer mixtures 23 and 24 were used instead of monomer mixture 4. The imaging elements were processed as in example 17 to obtain images of good quality. The required energies to obtain these images was respectively 24 $J/m^2$ and 48 $J/m^2$.

Monomer mixture 23 is similar to monomer mixture 4 with the exception that in the formula of table 1 $W^1$ and $W^2$ were equal to $G^2$. The amount of (meth)acrylate groups per 100 g was 0.48 mol.

Monomer mixture 24 is similar to monomer mixture 15 with the exception that in the formula of table 2 $W^3$ and $W^4$ were equal to $G^2$ and the amount of (meth)acrylate groups per 100 g was 0.48 mol.

We claim:

1. An imaging element comprising on a support a photosensitive layer containing a photopoly-merizable composition containing a monomer mixture according to formula (I):

$$A \begin{cases} [R^1-NHCO-X-R^2(-OCO-\overset{R^3}{\underset{|}{C}}=CH_2)_n]_m \\ [R^4-NHCO-X^1-Z^1]_a \\ [R^5-NHCO-X^2-Z^2]_b \end{cases}$$

wherein

A represents an organic group of the following nature being 2 to 6 valent:
  a) a hydrocarbon residue containing 5 to 25 carbon atoms that optionally is interrupted by one or more ether, ester or amide functions;
  b) a di- or tri-valent condensed urea residue;

X, $X^1$, $X^2$ each independently represents —O— or —NR— wherein

R represents an alkyl group of 1 to 12 carbon atoms, $R^1$, $R^4$, $R^5$ each independently represent a divalent hydrocarbon residue having 1 to 25 carbon atoms, $R^2$ represents a 2 to 6 valent linear or branched hydrocarbon residue containing 2 to 18 carbon atoms, $R^3$ represents hydrogen or methyl, n represents an integer of 1 to 5, $Z^1$ represents a non-ionic or ionic hydrophilic group containing at least a polyalkyleneoxy functionality, $Z^2$ represents a hydrophobic group having one of the following meanings:
  an alkyl, cycloalkyl, arylalkyl, alkylaryl or aryl group having at least 4 carbon atoms,
  an alkoxy group having at least 4 carbon atoms,
  fluoro alkyl group or perfluoro alkyl group having at least 4 carbon atoms,
  a silicone group, m, a and b are fractional indexes respectively representing the relative amount in said monomer mixture of the group indexed by said indexes m, a and b of formula (I) and whereby the amount of (meth)acrylate groups in 100 g of said monomer mixture is between 0.1 and 0.8 mol and at least a is different from 0 and m also differs from 0.

2. An imaging element according to claim 1 wherein said monomer mixture has an alkyleneoxide content between 0.04 and 2.5 mol per 100 g of said monomer mixture.

3. An imaging element according to claim 1 wherein said photosensitive layer further comprises a thermoplastic polymer.

4. An imaging element according to claim 1 wherein said imaging element comprises a base layer adjacent to said photosensitive layer and wherein said base layer contains a polymer containing polymerizable groups.

5. An imaging element according to claim 1 wherein on top of said photosensitive layer there is provided a porous layer containing a pigment.

6. A method for obtaining an image comprising the steps of image-wise exposing to actinic radiation an imaging element as defined in claim 1 and developing a thus obtained image-wise exposed imaging element using a developing liquid to remove non-exposed or insufficient exposed parts of said photosensitive layer.

7. A method for obtaining an image comprising the steps of image-wise exposing to actinic radiation an imaging element as defined in claim 1 and developing a thus obtained image-wise exposed imaging element by means of heat.

8. A method for obtaining an image according to claim 7 wherein during said development by means, of heat non-exposed or insufficient exposed parts of said photosensitive layer which are hydrophobic are transferred to an image-receiving material being in face-to-face contact with said imaging element.

9. A method for obtaining an image according to claim 8 wherein said image receiving material has a hydrophilic surface so that a lithographic printing plate is obtained.

* * * * *